United States Patent
Qin et al.

(10) Patent No.: US 12,016,139 B2
(45) Date of Patent: Jun. 18, 2024

(54) FLEXIBLE DISPLAY DEVICE AND MANUFACTURING METHOD THEREOF

(71) Applicant: Wuhan China Star Optoelectronics Semiconductor Display Technology Co., Ltd., Hubei (CN)

(72) Inventors: Lijun Qin, Hubei (CN); Yanqiang Duan, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 261 days.

(21) Appl. No.: 17/419,743

(22) PCT Filed: Apr. 2, 2021

(86) PCT No.: PCT/CN2021/085305
§ 371 (c)(1),
(2) Date: Jun. 30, 2021

(87) PCT Pub. No.: WO2022/193376
PCT Pub. Date: Sep. 22, 2022

(65) Prior Publication Data
US 2023/0156933 A1    May 18, 2023

(30) Foreign Application Priority Data
Mar. 15, 2021    (CN) .......................... 202110274201.0

(51) Int. Cl.
*H05K 5/00* (2006.01)
*G06F 1/16* (2006.01)
*H05K 5/02* (2006.01)

(52) U.S. Cl.
CPC ............. *H05K 5/02* (2013.01); *G06F 1/1601* (2013.01); *G06F 1/1652* (2013.01)

(58) Field of Classification Search
CPC ....... H05K 5/02; G06F 1/1601; G06F 1/1652; H10K 2102/311; H10K 77/111; Y02E 10/549; G09F 9/301
(Continued)

(56) References Cited

U.S. PATENT DOCUMENTS

2013/0010405 A1* 1/2013 Rothkopf ............. H05K 5/0226
361/679.01
2014/0307396 A1* 10/2014 Lee ................... G02F 1/133305
29/830
(Continued)

FOREIGN PATENT DOCUMENTS

| CN | 106449695 | 2/2017 |
| CN | 107146527 | 9/2017 |

(Continued)

*Primary Examiner* — Zhengfu J Feng

(57) ABSTRACT

A flexible display device and a manufacturing method thereof are provided. The flexible display device includes a flexible display panel, wherein the flexible display panel is bent at a preset position to form a first plane part, a bending part, and a second plane part, the preset position includes a first bending point and a second bending point, a distance between the first bending point and the second bending point is H, a middle point of a line formed by connecting the first bending point and the second bending point is located on a bending axis of the bending part, and a radius of curvature of at least one point on the bending part is greater than H/2.

10 Claims, 2 Drawing Sheets

(58) Field of Classification Search
USPC .......................................................... 361/807
See application file for complete search history.

(56) References Cited

U.S. PATENT DOCUMENTS

| | | | |
|---|---|---|---|
| 2015/0173172 A1 | 6/2015 | Yang et al. | |
| 2018/0040838 A1* | 2/2018 | Zhai ....................... | H10K 59/87 |
| 2019/0207130 A1* | 7/2019 | He .......................... | H10K 71/80 |
| 2019/0369776 A1 | 12/2019 | Wu et al. | |
| 2020/0119124 A1 | 4/2020 | Ahn et al. | |

FOREIGN PATENT DOCUMENTS

| | | |
|---|---|---|
| CN | 107425036 | 12/2017 |
| CN | 108198842 | 6/2018 |
| CN | 108292710 | 7/2018 |
| CN | 109256414 | 1/2019 |
| CN | 110531884 | 12/2019 |
| CN | 111562853 | 8/2020 |
| KR | 10-2019-0078842 | 7/2019 |

\* cited by examiner

FLEXIBLE DISPLAY DEVICE AND MANUFACTURING METHOD THEREOF

RELATED APPLICATIONS

This application is a National Phase of PCT Patent Application No. PCT/CN2021/085305 having International filing date of Apr. 2, 2021, which claims the benefit of priority of Chinese Patent Application No. 202110274201.0 filed on Mar. 15, 2021. The contents of the above applications are all incorporated by reference as if fully set forth herein in their entirety.

FIELD AND BACKGROUND OF THE INVENTION

The present application relates to the field of flexible display technology and specifically to a flexible display device and manufacturing method thereof.

With development of flexible display technology, development of flexible display devices that are thin and lightweight has become the mainstream in the industry.

However, the thinner a thickness of a flexible display device is, the greater a curvature of a bending part is, stress exerted on a connecting part of a bending part and a non-bending part becomes greater, and defects such as wiring breakage and delamination easily occur, significantly decreasing mass production yields of the flexible display device. With this limitation, so far a width of flexible display devices invariably cannot be further decreased in the industry, encountering a technical bottleneck when making flexible display devices lighter and thinner.

SUMMARY OF THE INVENTION

Embodiments of the present application provide a flexible display device and manufacturing method thereof to solve a technical problem that when a thickness of the flexible display device is excessively thin, wiring breaking and delamination occurs at a preset bending position of a flexible display panel due to excessive bending stress.

Embodiments of the present application provide a flexible display device that includes a flexible display panel, wherein the flexible display panel is bent at a preset position to form a first plane part, a bending part, and a second plane part, and the bending part is located between the first plane part and the second plane part; wherein the preset position comprises a first bending point located on a surface where the bending part meets the first plane part and a second bending point located on a surface where the bending part meets the second plane part, the first plane part lies on a first plane, and the first bending point and the second bending point lie on a second plane perpendicular to the first plane; wherein a distance between the first bending point and the second bending point is H, a bending axis of the bending part is perpendicular to the second plane, and a middle point of a line formed by connecting the first bending point and the second bending point is located on the bending axis; and wherein in the second plane, at least one radius of curvature of a point on the bending part is greater than H/2.

Optionally, in some embodiments of the present application, the second plane part is parallel to the first plane; wherein in the second plane, a distance between a curved-surface vertex of the bending part and the first plane part is equal to a distance between the curved-surface vertex and the second plane part.

Optionally, in some embodiments of the present application, a difference between a longest radius of curvature r of the bending part and a shortest radius of curvature H/2 is at least greater than 120 μm.

Optionally, in some embodiments of the present application, a bending axis of the bending part is perpendicular to the second plane, a middle point of a line formed by connecting the first bending point and the second bending point is located on the bending axis, and an angle between a plane formed by the curved-surface vertex and the bending axis and the first plane part ranges from 0 degrees to 30 degrees.

Optionally, in some embodiments of the present application, an angle between a plane formed by a curved-surface vertex of the bending part on the second plane and a bending axis of the bending part and the first plane part and/or the second plane part ranges from 0 degrees to 30 degrees.

Optionally, in some embodiments of the present application, the flexible display device further includes a backplate, wherein the flexible display panel is disposed on the backplate, a first backplate of the backplate is disposed corresponding to the first plane part, the first plane part is located on the first backplate, a groove part is defined at where the backplate corresponds to the bending part, the bending part is disposed corresponding to the groove part, a second backplate of the backplate is disposed corresponding to the second plane part, and the second plane part is located on the second backplate; wherein the second plane part is bent to one side of the first backplate away from the first plane part, and a design value of a length L of the groove part before bending satisfies following formula:

$$L = \alpha \pi (H-h)/2$$

wherein α is a bending process accuracy corrected value, H is a distance between the first bending point and the second bending point, and h is a thickness of the flexible display panel.

Optionally, in some embodiments of the present application, the bending process accuracy corrected value α satisfies following formula:

$$\alpha = (A^2 + B^2 + C^2)^{1/2}$$

Wherein A is a manufacturing accuracy of the groove part, B is a lamination accuracy of the flexible display panel and the backplate, and C is a bending alignment accuracy of the first backplate and the second backplate.

Optionally, in some embodiments of the present application, the flexible display device includes a composite supporting structure, wherein the composite supporting structure is located between the first plane part and the second plane part after bending, the composite supporting structure separately abuts the first backplate and the second backplate, and the distance H between the first bending point and the second bending point satisfies following formula:

$$H = 2(h+a) + b$$

Wherein h is a thickness of the flexible display panel, a is a thickness of the backplate, and b is a thickness of the composite supporting structure.

Optionally, in some embodiments of the present application, a shape of the bending part comprises an ellipse curved surface.

Optionally, in some embodiments of the present application, in the second plane, the bending part has a curved-surface vertex, a radius of curvature of the bending part gradually increases in an interval from the first bending point to the curved-surface vertex, and the radius of curvature of the bending part gradually decreases in an interval from the curved-surface vertex to the second bending point.

Optionally, in some embodiments of the present application, in the second plane, the radius of curvature of the bending part varies between a shortest radius of curvature H/2 and a longest radius of curvature r.

Embodiments of the present application further provides a manufacturing method of the above-described flexible display device that includes:

B1, obtaining a length L of a groove part trenched in a backplate corresponding to the bending part before bending according to following formula:

$$L=\alpha\pi(H-h)/2$$

Wherein α is a bending process accuracy corrected value, H is a target distance between the first bending point and the second bending point, and h is a thickness of the flexible display panel;

B2, presetting a bending trajectory of the bending part by a bending apparatus of the flexible display panel according to the length L of the groove part and the target distance H between the first bending point and the second bending point, such that a distance between a curved-surface vertex of the bending part in the second plane and the first plane part is equal to a distance between the curved-surface vertex and the second plane part;

B3, bending the flexible display panel by the bending apparatus according to the preset bending trajectory such that a difference between a longest radius of curvature r of the bending part and H/2 is at least greater than 120 μm.

Optionally, in some embodiments of the present application, step B2 further includes presetting the bending trajectory of the bending part such that a bending axis of the bending part is perpendicular to the second plane, a middle point of a line formed by connecting the first bending point and the second bending point is located on the bending axis, and an angle between a plane formed by the curved-surface vertex of the bending part after bending and the bending axis and the first plane part ranges from 0 degrees to 30 degrees.

Optionally, in some embodiments of the present application, the bending process accuracy corrected value α satisfies following formula:

$$\alpha=(A^2+B^2+C^2)^{1/2}$$

Wherein A is a manufacturing accuracy of the groove part, B is a lamination accuracy of the flexible display panel and the backplate, and C is a bending alignment accuracy of the first backplate and the second backplate.

Optionally, in some embodiments of the present application, the flexible display device comprises a composite supporting structure, and step B3 includes wherein the first plane part is located on one side of the composite supporting structure, bending the second plane part to another side of the composite supporting structure, such that the composite supporting structure separately abuts a first backplate and a second backplate, and the distance H between the first bending point and the second bending point satisfies following formula:

$$H=2(h+a)+b$$

Wherein h is a thickness of the flexible display panel, a is a thickness of the backplate, and b is a thickness of the composite supporting structure.

Optionally, in some embodiments of the present application, the bending trajectory of the bending part comprises an ellipse curved surface.

Optionally, in some embodiments of the present application, in step B2, presetting the bending trajectory of the bending part such that a radius of curvature of the bending part gradually increases in an interval from the first bending point to the curved-surface vertex, and the radius of curvature of the bending part gradually decreases in an interval from the curved-surface vertex to the second bending point.

Optionally, in some embodiments of the present application, in step B2, presetting the bending trajectory of the bending part such that in the second plane, the radius of curvature of the bending part varies between a shortest radius of curvature H/2 and the longest radius of curvature r.

Optionally, in some embodiments of the present application, step B3 comprises bending the flexible display panel by the bending apparatus according to the preset bending trajectory such that the difference between the longest radius of curvature r of the bending part and H/2 is at least greater than 200 μm.

While decreasing a thickness of the entire flexible display device, a distance between the first bending point and the second bending point at two ends of the bending part is decreased, and through lengthening the greatest radius of curvature r of the bending part to be greater than half the distance between the first bending point and the second bending point, a curved surface of the bending part includes an ellipse curved surface, thereby decreasing bending stress at the first bending point and the second bending point, preventing wiring on the flexible display panel from defects such as breakage and delamination due to excessive bending stress, and significantly increasing mass production yield of the ultra-thin flexible display panel.

BRIEF DESCRIPTION OF THE SEVERAL VIEWS OF THE DRAWINGS

The accompanying figures to be used in the description of embodiments of the present application will be described in brief to more clearly illustrate the technical solutions of the embodiments. The accompanying figures described below are only part of the embodiments of the present application, from which figures those skilled in the art can derive further figures without making any inventive efforts.

DESCRIPTION OF SPECIFIC EMBODIMENTS OF THE INVENTION

For better clearness and definiteness of purpose, technical approach, and effect of the present application, the following further describes embodiments of the present application in detail with reference to accompanying drawings. It should be understood that the embodiments described here is merely for explaining the present application and not intended to limit the present application.

The present application provides a reference coordinate system, specifically including an XY-plane, an YZ-plane, and an XZ-plane defined by a first direction X, a second direction Y, and a third direction Z, for clearer elaborating a technical approach of the present application.

Figure 1:
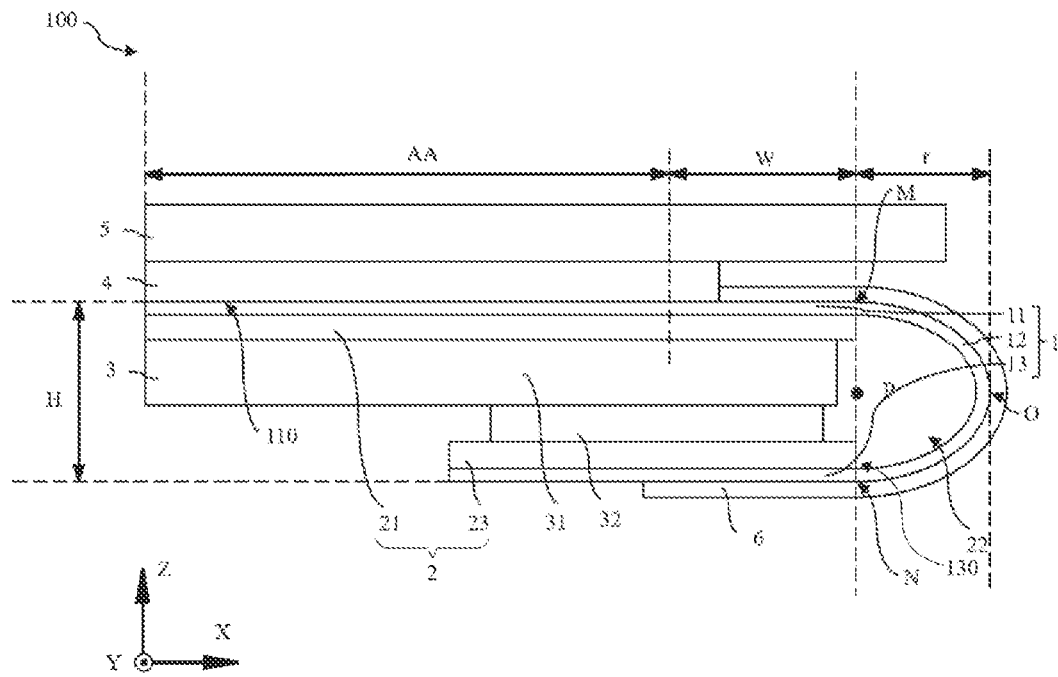
FIG. 1 is a schematic side view of a flexible display device according to a first embodiment of the present application.

The present application provides a first embodiment as shown in FIG. 1, a flexible display device 100 that includes a flexible display panel 1, a backplate 2, a composite supporting structure 3, a polarizer 4, a cover plate 5, and a protection layer 6.

The flexible display panel 1 includes a display area AA for displaying images. The display area AA is on a plane that is parallel to the XY-plane. For decreasing a border width of the flexible display device 100 as much as possible, the flexible display panel 1 can be bent at a preset position. When the flexible display panel 1 is bent in a way shown in FIG. 1, the flexible display panel 1 can be divided into a first plane part 11, a bending part 12, and a second plane part 13 sequentially connected, and the bending part 12 is located between the first plane part 11 and the second plane part 13.

The first plane part 11 lies on a first plane 110 that is parallel to the XY-plane, and the display area AA is located on the first plane part 11. Pixels (not shown) for displaying images and signal lines (not shown) for transmitting driving signals are formed on the display area AA, conventional technology in the industry can be adopted for specific pixel and circuit structures, and they are not limited here.

Figure 2:
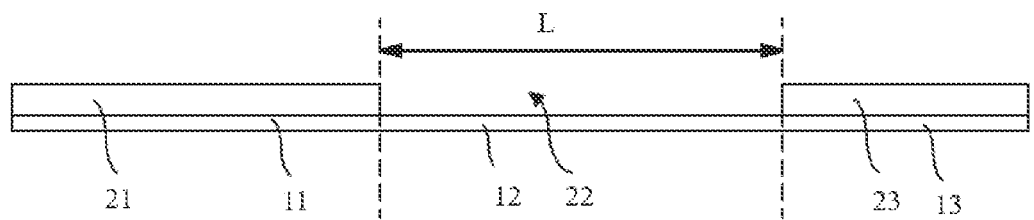
FIG. 2 is a structural schematic diagram of a flexible display panel and a backplate in FIG. 1 before bending.
Figure 3:
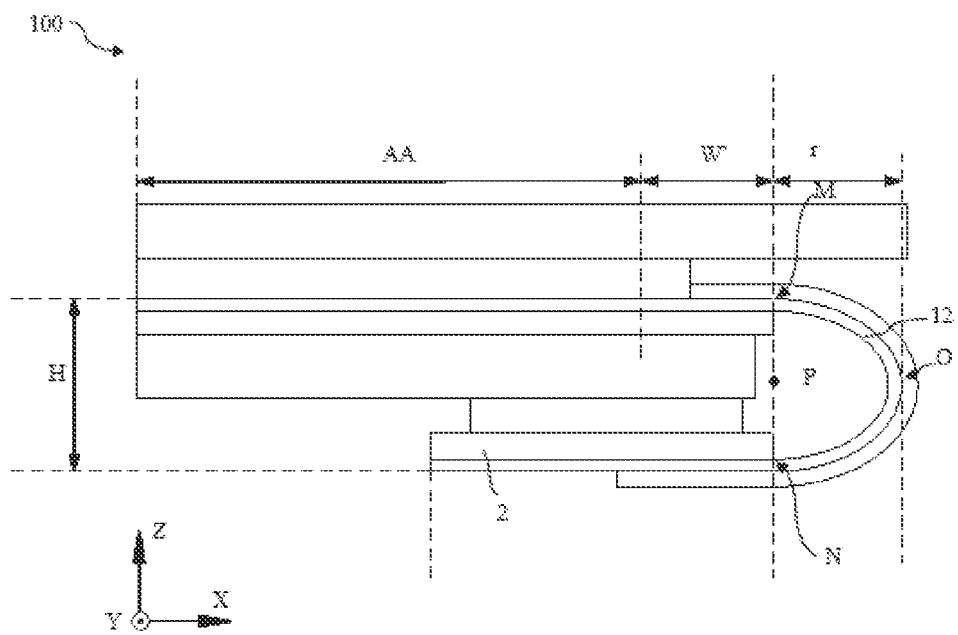
FIG. 3 is a side view of a flexible display device according to a second embodiment of the present application.

The preset position includes a first bending point M located on a surface where the bending part 12 meets the first plane part 11 and a second bending point N located on a surface where the bending part 12 meets the second plane part 13. The first bending point M is located on one surface of the first plane part 11 closer to the polarizer, and the second bending point N is located on one surface of the second plane part 13 away from the polarizer. Both the first bending point M and the second bending point N are on a second plane 130 perpendicular to the first plane 110. The second plane 130 is parallel to the XZ-plane, and the second plane 130 is perpendicular to the first plane 110. FIG. 1 to FIG. 3 are structural schematic diagrams of the flexible display device presented on the second plane 130.

It can be understood that deformation of the first plane part 11 and the second plane part 13 is less than deformation of the bending part 12, and the first plane part 11 and the second plane part 13 is not necessarily a flat surface. In other embodiments, the entire flexible display panel 1 can be bent or rolled. In other words, the bending part 12 is not limited to a part of the flexible display panel 1 that is bent as shown in the drawing, and any part of the flexible display panel 1, when bent, can be at least one of the first plane part 11, the bending part 12, and the second plane part 13.

On the second plane, a shape of the bending part 12 is elliptical, the first bending point M and the second bending point N are separately located at two ends of the bending part 12, and a distance between the first bending point M and the second bending point N is H. Through forming a perpendicular line with respect to the second plane at a middle point of a line formed by connecting the first bending point M and the second bending point N, a bending axis P of the bending part 12 can be obtained.

On the second plane 130, a radius of curvature of the bending part 12 can be defined as a shortest distance from the bending axis P to a designated point on a surface of the bending part 12 away from the bending axis P. For example, in the second plane 130 shown in FIG. 1, a radius of curvature of the bending part 12 at point M and point N is H/2, and a radius of curvature at a point O on the bending part 12 farthest from the bending axis P is r. In the second plane 130, it can be observed that a distance from the bending axis P to a surface of the bending part 12 away from the bending axis P keeps varying between H/2 and r. That is, the bending part 12 has a radius of curvature that constantly varies between H/2 and r. When a shape of the bending part 12 is elliptical as shown in the drawing, a radius of curvature at a curved-surface vertex O is the longest radius of curvature r, and r is greater than H/2.

In the second plane 130, the radius of curvature of the bending part 12 gradually increases in an interval from the first bending point M to the curved-surface vertex O. In the second plane 130, the radius of curvature of the bending part 12 gradually decreases in an interval from the curved-surface vertex O to the second bending point N.

It can be understood that, in other embodiments of the present application, the bending part 12 can include a plurality of bending portions, and as long as a radius of curvature of at least one point on the bending part 12 is greater than H/2, stress at the first bending point M and the second bending point N can be decreased to a certain degree.

Also referring to FIG. 2, the backplate 2 includes a first backplate 21 corresponding to the first plane part 11 and a second backplate 23 corresponding to the second plane part 13, and a groove part 22 corresponding to the bending part 12 is formed between the first backplate 21 and the second backplate 23. The backplate 2 can be manufactured by adopting organic insulation materials capable of blocking water and oxygen such as polyimide (PI) and/or polyethylene terephthalate (PET).

The flexible display panel 1 is formed on the backplate 2. Wherein, the first plane part 11 is located on the first backplate 21, the bending part 12 is disposed corresponding to the groove part 22, and the second plane part 13 is located on the second backplate 23. In some embodiments, the groove part 22 can penetrate the backplate 2 in a thickness direction of the backplate 2 to expose a part of the flexible display panel 1, so as to increase flexibility of the flexible display panel 1 at the bending part 12 as much as possible.

When a target thickness of the flexible display device 100 is decided, a target distance H between the first bending point M and the second bending point N can also be decided. Because a length of a curve segment formed by bending the bending part 12 and a length L of the groove part 22 are nearly identical, the longest radius of curvature r of the bending part 12 is decided by the length L of the groove part 22 before bending.

The present application provides a design formula for the length L of the groove part 22 before bending as follows:

$$L=\alpha\pi(H-h)/2$$

Wherein, α is a bending process accuracy corrected value, H is a distance between the first bending point M and the second bending point N, and h is a thickness of the flexible display panel 1.

In actual production, the bending process accuracy corrected value α satisfies a following formula:

$$\alpha=(A^2+B^2+C^2)^{1/2}$$

Wherein, A is a manufacturing accuracy of the groove part 22, B is a lamination accuracy of the flexible display panel 1 and the backplate 2, and C is a bending alignment accuracy of the first backplate 21 and the second backplate 23.

When the length L of the groove part 22 before bending is calculated through the above-described formulas, a bending apparatus of the flexible display panel 1 can preset a bending trajectory of the bending part 12 according to the length L of the groove part obtained and the target distance H between the first bending point M and the second bending point N, obtaining an r value. When the display panel 1 is bent in a way shown in FIG. 1, so that a point O on the bending part 12 farthest from the bending axis P has an equal distance from the first plane part 11 and the second plane part 13, the r value can be obtained through a commonly used perimeter formula for an ellipse: L=2r+H+πH/2

The composite supporting structure 3 is located between the first plane part 11 and the second plane part 13 after bending, the composite supporting structure 3 includes a supporting layer 31 and a lamination layer 32, and the supporting layer 31 is disposed on the lamination layer 32.

Wherein, the supporting layer 31 includes a composite structure of a metal heat dissipation layer (not shown), a foam supporting layer (not shown), etc. The first backplate 21 is located between the supporting layer 31 and the first plane part 11, and one surface of the supporting layer 31 abuts the first backplate 21 and is fixedly laminated. The lamination layer 32 can use a common double-sided tape, and the lamination layer 32 fixedly laminates together the other surface of the supporting layer 31 and a surface of the second backplate 23.

The protection layer 6 often adopts ultraviolet (UV) adhesive. The protection layer 6 is configured to protect the bending part 12 of the flexible display panel 1 from damage due to external force. One end of the protection layer 6 extends to a surface of the first plane part 11, and the other end of the protection layer 6 extends to a surface of the second plane part 13.

In the present embodiment, the distance H between the first bending point M and the second bending point N satisfies a following formula:

$$H=2(h+a)+b$$

Wherein, h is a thickness of the flexible display panel 1, a is a thickness of the backplate 2, and b is a thickness of the composite supporting structure 3.

In conventional technology, a radius of curvature of a bending part is a fixed value and equals H/2. In order to fulfill a need of constantly decreasing a thickness of flexible display devices in the industry, a distance H between the first bending point M and the second bending point N is constantly decreased, and the radius of curvature of the bending part is also decreased correspondingly. However, the shorter the radius of curvature of the bending part is, the greater bending stress exerted at two stress concentration points of the first bending point M and the second bending point N of a flexible display panel is. When H is less than 0.5 mm, the bending stress exerted at the two stress concentration points of the first bending point M and the second bending point N of the flexible display panel is excessively great, and this easily causes defects such as wiring breaking and delamination, significantly decreasing manufacturing yields of flexible display devices. Embodiments of the present application provides an approach that while adaptively decreasing the H value, through lengthening the longest radius of curvature r of the bending part 12 to make the bending part 12 become an ellipse shape, a bending angle of the bending part 12 at the first bending point M and the second bending point N is decreased to decrease bending stress at the first bending point M and the second bending point N, thereby solving the above-described technical problem.

In embodiments shown in the drawings, the second plane part 13 lies on a plane that is parallel to the XY-plane and the first plane 110. In the second plane 130 shown in the drawings, an end point N on a surface of the second plane part 13 aligns with an end point M on a surface of the first plane part 11 in a vertical direction, so that a distance between the curved-surface vertex O of the bending part 12 and the first plane part 11 is equal to a distance between the curved-surface vertex O and the second plane part 13. At this time, the longest radius of curvature r of the bending part 12 at the curved-surface vertex O is greater than the shortest radius of curvature H/2 at the first bending point M and the second bending point N by at least 120 μm. In some embodiments of the present application, the longest radius of curvature r of the bending part 12 at the curved-surface vertex O is greater than the shortest radius of curvature H/2 at the first bending point M and the second bending point N by at least 200 μm.

It can be understood that, when designing a bending trajectory of the bending part 12, the curved-surface vertex O of the bending part 12 can also be closer to the first plane part 11 or the second plane part 13 to adapt to different application situations or match different housings. In such embodiments, an angle between a plane formed by the curved-surface vertex O of the bending part 12 and the bending axis P and the XY-plane ranges from 0 degrees to 30 degrees. That is, the curved-surface vertex O of the bending part 12 can be shifted closer to the first plane part 11 or the second plane part 13 within an angle of 30 degrees.

It can be understood that the flexible display panel 1 can also have various bending angles. The drawings merely illustratively show a flexible display device whose first plane part 11 is parallel to the second plane part 13. In other embodiments of the present application, an angle between a plane which the first plane part 11 lies on and a plane which the second plane part 13 lies on can be 60 degrees, 90 degrees, etc., and they are not limited here.

In the first embodiment, the longest radius of curvature r of the bending part 12 is lengthened, leading to a widened border width of the flexible display device 100. As shown in FIG. 1, the border width of the flexible display device 100 includes a width W of a non-display area and the greatest radius of curvature r of the bending part 12.

In order to realize a narrow border design of the flexible display device 100, the present application provides a second embodiment as shown in FIG. 3. A width W' of the non-display area in the second embodiment is less than the width W of the non-display area in the first embodiment. Through decreasing the width W' of the non-display area, a sum of W' and r is less than or equal to a sum of W and r in the first embodiment, thereby ensuring the border width of the flexible display device 100 to remain unchanged or become narrower, satisfying a current trend of narrow border design.

In the present embodiment, the width W' of the non-display area can be realized by shrinking a wiring area of a fan-out area, adjusting a position of a driving control wiring, etc., and they are not limited here.

The present application further provides a manufacturing method of the above-described flexible display device 100, including:

B1, obtaining a length L of the groove part 22 on the backplate 2 before bending according to a following formula:

$$L=\alpha\pi(H-h)/2$$

Wherein, H is a target distance between the first bending point M and the second bending point N, h is a thickness of the flexible display panel 1, and a is a bending process accuracy corrected value.

In actual production, the bending process accuracy corrected value α satisfies a following formula:

$$\alpha=(A^2+B^2+C^2)^{1/2}$$

Wherein, A is a manufacturing accuracy of the groove part 22, B is a lamination accuracy of the flexible display panel 1 and the backplate 2, and C is a bending alignment accuracy of the first backplate 21 and the second backplate 23.

B2, presetting a bending trajectory of the bending part 12 by a bending apparatus of the flexible display panel 1 according to the length L of the groove part obtained in step B1 and the target distance H between the first bending point M and the second bending point N.

In embodiments shown in the drawings, the bending trajectory of the bending part 12 includes an ellipse curved surface, and a distance between the curved-surface vertex O of the bending part 12 and the first plane part 11 is equal to a distance between the curved-surface vertex O and the second plane part 13. A radius of curvature r at the curved-surface vertex O is greater than H/2.

B3, bending the flexible display panel 1 by the bending apparatus according to the preset bending trajectory such that a difference between a longest radius of curvature r of the bending part 12 and H/2 is at least greater than 120 μm.

Figure 4:
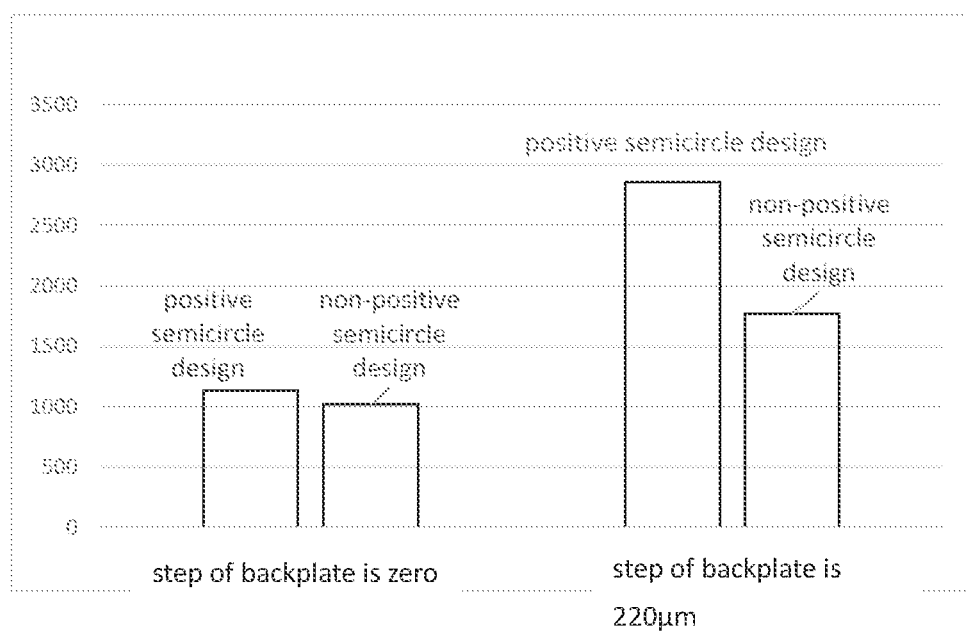
FIG. 4 is an experimental test chart of the flexible display device according to the present application.

FIG. 4 shows an experimental test chart for stress of the flexible display device according to the present application. In the drawing, under an ideal condition where step of the backplate 2 is zero, i.e., when a dislocation distance between an edge of the first backplate 21 and an edge of the second backplate 23 after bending is zero, average stress at the first bending point M and the second bending point N simulated when the bending part 12 adopting a positive semicircle design is 1134 MPa, and average stress at the first bending point M and the second bending point N simulated when the bending part 12 adopting a non-perfect semicircle design is 1022 MPa. 112 MPa of stress can be decreased by using design of the present application.

Under real production test adjustment, an alignment error between the edge of the first backplate 21 and the edge of the second backplate 23 after bending is inevitable. In a real test, when step of the backplate 2 is 220 μm, i.e., when a dislocation distance between the edge of the first backplate 21 and the edge of the second backplate 23 after bending is 220 μm, average stress at the first bending point M and the second bending point N obtained when the bending part 12 adopting a positive semicircle design is 2858 MPa, and average stress at the first bending point M and the second bending point N obtained when the bending part 12 adopting a non-perfect semicircle design is 1769 MPa. 1089 MPa of stress can be decreased by using design of the present application.

In the present application, while decreasing a thickness of the entire flexible display device, a distance H between the first bending point M and the second bending point N at two ends of a surface of the bending part 12 is adaptively decreased, and through lengthening the greatest radius of curvature r of the bending part 12 to be greater than H/2, a curved surface of the bending part 12 includes an ellipse curved surface, thereby decreasing bending stress at the first bending point M and the second bending point N, preventing wiring on the flexible display panel from defects such as breakage and delamination due to excessive bending stress, and significantly increasing mass production yield of the ultra-thin flexible display panel.

The technical approach of the present application overcomes a technical bottleneck in conventional technology that the distance H between the first bending point M and the second bending point N is restricted by a radius of curvature R of the bending part and cannot be further decreased. In the conventional technology, a thickness of H ranges between 0.5 mm and 0.7 mm, and through improvement of the present application, the value of H can be decreased to less than 0.5 mm. While ensuring mass production yield, a further decrease of a thickness of the flexible display device becomes possible.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. A flexible display device, comprising:
a backplate;
a flexible display panel, wherein the flexible display panel is bent at a preset position to form a first plane part, a bending part, and a second plane part, and the bending part is located between the first plane part and the second plane part;
wherein the preset position comprises a first bending point located on a surface where the bending part meets the first plane part and a second bending point located on a surface where the bending part meets the second plane part, the first plane part lies on a first plane, and the first bending point and the second bending point lie on a second plane perpendicular to the first plane; and
wherein a distance between the first bending point and the second bending point is H, and on the second plane, a radius of curvature of the bending part is greater than H/2,
wherein the flexible display panel is disposed on the backplate, a first backplate is disposed on the backplate corresponding to the first plane part, the first plane part is located on the first backplate, a groove part is defined on the backplate corresponding to the bending part, the bending part is disposed corresponding to the groove part, a second backplate is disposed on the backplate corresponding to the second plane part, and the second plane part is located on the second backplate;
wherein the second plane part is bent to one side of the first backplate towards the first plane part, and a design h L of the groove part before bending satisfies a following formula:

$$L = \alpha \pi (H-h)/2;$$

wherein α is a bending process accuracy corrected value, H is a distance between the first bending point and the second bending point, and h is a thickness of the flexible display panel.

2. The flexible display device as claimed in claim 1, wherein the second plane part is parallel to the first plane; and
wherein on the second plane, a distance between a curved-surface vertex of the bending part and the first plane part is equal to a distance between the curved-surface vertex and the second plane part.

3. The flexible display device as claimed in claim 2, wherein a difference between a longest radius of curvature r of the bending part and a shortest radius of curvature H/2 is at least greater than 120 μm.

4. The flexible display device as claimed in claim 3, wherein the difference between the longest radius of curvature r of the bending part and the shortest radius of curvature H/2 is at least greater than 200 μm.

5. The flexible display device as claimed in claim 2, wherein a bending axis of the bending part is perpendicular to the second plane, a middle point of a line formed by connecting the first bending point and the second bending point is located on the bending axis, and an angle between a plane formed by the curved-surface vertex and the bending axis and the first plane part ranges from 0 degrees to 30 degrees.

6. The flexible display device as claimed in claim 1, wherein an angle between a plane formed by a curved-surface vertex of the bending part on the second plane and a bending axis of the bending part and the first plane part and/or the second plane part ranges from 0 degrees to 30 degrees.

7. The flexible display device as claimed in claim 1, comprising a composite supporting structure, wherein the composite supporting structure is located between the first plane part and the second plane part after bending, the composite supporting structure separately abuts the first backplate and the second backplate, and the distance H between the first bending point and the second bending point satisfies a following formula:

$$H=2(h+a)+b$$

wherein h is a thickness of the flexible display panel, a is a thickness of the backplate, and b is a thickness of the composite supporting structure.

8. The flexible display device as claimed in claim 1, wherein a shape of the bending part comprises an elliptical curved surface.

9. The flexible display device as claimed in claim 1, wherein on the second plane, the bending part has a curved-surface vertex, the radius of curvature of the bending part gradually increases in an interval from the first bending point to the curved-surface vertex, and the radius of curvature of the bending part gradually decreases in an interval from the curved-surface vertex to the second bending point.

10. The flexible display device as claimed in claim 1, wherein on the second plane, the radius of curvature of the bending part varies between a shortest radius of curvature H/2 and a longest radius of curvature r.

* * * * *